United States Patent [19]

Ho

[11] Patent Number: 4,954,214

[45] Date of Patent: Sep. 4, 1990

[54] METHOD FOR MAKING INTERCONNECT STRUCTURES FOR VLSI DEVICES

[75] Inventor: Vu Quoc Ho, Kanata, Canada

[73] Assignee: Northern Telecom Limited, Montreal, Canada

[21] Appl. No.: 293,789

[22] Filed: Jan. 5, 1989

[51] Int. Cl.$^5$ .................. H01L 21/308; H01L 21/283
[52] U.S. Cl. ................................ 156/628; 156/652;
156/653; 156/655; 156/656; 156/657; 437/228
[58] Field of Search ............ 156/656, 657, 655, 658.1,
156/628, 652, 653; 437/228

[56] References Cited

U.S. PATENT DOCUMENTS

| | | | |
|---|---|---|---|
| 4,317,700 | 3/1982 | Tanaka et al. | 156/656 |
| 4,585,515 | 4/1986 | Maa | 156/656 |
| 4,652,334 | 3/1987 | Jain et al. | 156/628 |
| 4,753,709 | 6/1988 | Welch et al. | 156/656 |
| 4,844,776 | 7/1989 | Lee et al. | 156/657 |

OTHER PUBLICATIONS

Gregory Smith, CVD Tungsten Contact Plugs by in Situ Deposition and Etchback, Jun. 25-26, 1985 V-MIC Conf.
Mehta et al, Blanket CVD Tungsten Interconnect for VLSI Devices, Jun. 9-10, 1986 V-MIC Conf.
Higelin et al, A Contact Filling Process with CVD—Tungsten for Multilevel Metallization Systems, Jun. 9-10, 1986 V-MIC Conf.
U.S. Application No. 199,489 Filed May 27, 1988 and co-pending Canadian Application No. 567,935 filed May 27, 1988.
Broadbent et al, "High-Density High-Reliability Tungsten Interconnection by Filled Interconnect Groove Metallization", IEEE Transactions on Electron Devices, vol. 35, No. 7, pp. 952-956, Jul. 1988.
U.S. Application No. 207,568 filed Jun. 16, 1988 and co-pending Canadian Application No. 569,516 filed Jun. 15, 1988.
Proceedings of the IEEE V-MIC Conference, pp. 331-337, Jun. 13-14, 1988. Pai et al.
Hennessy et al "Selective CVD Tungsten on Silicon Implanted SiO$_2$", Journal of the Electrochemical Society, Solid State Science and Technology, pp. 1730-1734, Jul. 1988.

Primary Examiner—Kenneth M. Schor
Assistant Examiner—Todd J. Burns
Attorney, Agent, or Firm—C. W. Junkin

[57] ABSTRACT

In methods for making interconnect structures for semiconductor devices a layer of seed material is formed on a first substantially planar dielectric layer which covers the semiconductor devices at predetermined locations where interconnect conductor is desired, a second substantially planar dielectric insulating layer is formed over the first substantially planar dielectric insulating layer and the seed material, the second layer having openings extending therethrough at the predetermined locations to expose at least a portion of the seed material, and conductive material is selectively deposited on the exposed seed material to fill the openings. The seed material may be a material in the group consisting of aluminum alloys, refractory metals and metal silicides, or may be SiO$_2$ selectively implanted with silicon ions. The insulating material may be SiO$_2$. The conductive material used to fill the openings may be tungsten deposited by selective CVD or nickel deposited by selective electroless nickel plating. The steps of the methods may be repeated to form a multilevel interconnect structure. The methods are particularly suited to making interconnect structures for submicron devices.

14 Claims, 9 Drawing Sheets

METHOD FOR MAKING INTERCONNECT STRUCTURES FOR VLSI DEVICES

FIELD OF THE INVENTION

This invention relates to methods for making interconnect structures for Very Large Scale Integration (VLSI) devices and to interconnect structures made by those methods.

BACKGROUND OF THE INVENTION

Individual semiconductor devices in VLSI integrated circuits are interconnected by means of one or more patterned conductive layers overlying the semiconductor devices. It is particularly advantageous to provide a plurality of patterned conductive layers separated from one another and from the underlying semiconductor devices by layers of insulating material. This practice permits a higher density of interconnections per unit area than can be provided by a single patterned conductive layer, and simplifies design by permitting interconnection paths implemented in one conductive layer to cross over interconnection paths implemented in other conductive layers.

Multilevel interconnection structures are conventionally made by alternately depositing and patterning layers of conductive material, typically aluminum alloys such as Al-Si, and layers of insulating material, typically $SiO_2$. The patterning of underlying layers defines a nonplanar topography which complicates reliable formation of overlying layers. In particular, the non-planar topography of underlying conductive layers is replicated in overlying insulating layers to provide vertical steps in the insulating layers. Moreover, small holes are formed in the insulating layers to permit interconnection to underlying conductive layers or device contacts.

The subsequent formation of conductive layers overlying the nonplanar topography of the insulating layers is complicated by thinning of the conductive layers at the tops of the steps, cusping or microcracking of the conductive layers at the bottoms of the steps, and formation of voids in the conductive layers in small via and contact holes, all of which can lead to high resistance interconnections or undesired open circuits. Moreover, uneven formation of the conductive layers reduces the resistance of the patterned conductive material to electromigration, reducing the reliability of the completed integrated circuit.

Patterning of the resulting conductive layers may also be complicated by the nonplanar topography. For example, conductive material at the bottom of steps is difficult to remove and may provide unwanted conductive paths between adjacent regions of a conductive layer.

The formation of further insulating layers is also complicated by the nonplanar topography of the conductive layers. Weaknesses are present in the insulating layers at the tops and bottoms of steps. Cracks form at such weaknesses, providing unwanted conductive paths between adjacent conductive layers. Narrow troughs between steps in the conductive layers are difficult to fill with commonly used insulating materials, such as $SiO_2$ without the formation of voids.

The Resist Etch Back (REB) technique is frequently used to modify the nonplanar topography of insulating layers in an effort to minimize or avoid the above problems. In the REB technique, a thick layer of photoresist is formed on a nonplanar insulating layer and the photoresist is etched back until peaks or steps in the insulating layer topography are exposed, but valleys or troughs in the insulating layer topography are filled with remaining photoresist. The etching process is then controlled so that the etch rate of the insulating layer is substantially equal to the etch rate of the photoresist. Peaks or steps in the insulating layer topography are etched while valleys or troughs are protected by the photoresist so the height of the peaks or steps is reduced. After the etching is complete, remaining photoresist is removed and additional insulating material is deposited if required to build the insulating layer up to a desired thickness. The next conductive layer is then deposited on the insulating layer, which is now relatively smooth, and the conductive layer is patterned.

In related etch back planarization techniques, the photoresist may be replaced by other materials, such as Spin On Glass (SOG).

While etch back techniques reduce the height of peaks or steps in the insulating layer topography, they do not necessarily eliminate the sharp edges or vertical sidewalls of steps. These sharp edges and vertical sidewalls cause many of the problems referred to above, and such problems persist when conventional etch back techniques are used.

Etch back techniques are also subject to macroloading and microloading effects which can have a considerable impact on the results obtained in a production environment. The macroloading effect is a run to run or wafer to wafer variation of the relative etch rates of the insulating material and photoresist. Because the etch rates must be substantially equal to obtain an optimum reduction in step height, such variations cause a reduction in step height which is less than optimum. In severe cases, macroloading effects may actually accentuate deviations from a planar topography.

The microloading effect is enhanced localized etching of the photoresist in narrow valleys or troughs and at the edges of steps in the insulating layer. Microloading is primarily due to oxygen species liberated during etching of the insulating layer defining the side walls of the valleys, troughs or steps. The enhanced localized etching causes formation of sharp notches or trenches which in turn cause the problems referred to above.

The performance of etch back techniques can be improved somewhat by combining them with low pressure ion milling techniques, as described in co-pending U.S. application Ser. No. 199,489 filed May 27, 1988 in the name of Thomas Abraham. However, even this improved technique seeks to planarize a nonplanar topography instead of avoiding the formation of the nonplanar topography in the first place.

Some research facilities are studying the use of polyimide insulating layers in place of the more conventional $SiO_2$ insulating layers. Unlike $SiO_2$ insulating layers, polyamide insulating layers need not conform to the underlying topography and can therefore be deposited with substantially planar upper surfaces. Consequently most of the problems discussed above can be avoided without the use of etch back techniques by providing substantially planar insulating layers. Unfortunately, much more work is required to prove that polyimides can be used reliably in commercial device fabrication. As an insulator, $SiO_2$ is still the preferred dielectric because of its proven compatibility with silicon devices and the accumulated experience with its use in commercial device fabrication.

Broadbent et al have recently proposed a Filled Interconnect Groove (FIG) technique for forming multilevel interconnect structures (IEEE Transactions on Electron Devices, Vol. 35, No. 7, pp. 952-956, July 1988). In the technique proposed by Broadbent et al, a substantially planar insulating layer of phosphosilicate glass is deposited by Chemical Vapour Depositon (CVD) over devices formed in a silicon substrate. The glass insulating layer is patterned to form grooves which extend through the glass insulating layer where interconnect metallization is desired. An adhesion bilayer consisting of 20 nm of tungsten and 20 nm of titanium is deposited by DC magnetron sputtering over the glass insulating layer and in the grooves. Tungsten is then deposited on the adhesion bilayer by CVD to form a tungsten blanket which covers the entire upper surface of the adhesion bilayer and fills the grooves. The tungsten blanket is then etched back to expose the glass insulating layer between the grooves, thereby providing a substantially planar interconnect structure.

Unfortunately, loading effects encountered during the etch back step reduce the effectiveness of the technique proposed by Broadbent et al. In particular, the local etch rate of the tungsten blanket is found to be dependent on the ratio between the surface area covered by tungsten and the surface area of exposed glass. Consequently tungsten is removed faster from portions of the structure where a relatively large surface area of glass is exposed than from portions of the structure where little or no glass is exposed. Thus, any nonuniformity in the deposition of the tungsten blanket which results in nonuniform thickness of the tungsten blanket can result in total removal of tungsten from grooves on one part of the structure before the glass between grooves is exposed on another part of the structure. This results in undesired open circuits and short circuits in the interconnect structure. Moreover, nonuniformity of the tungsten etch rate prevents matching of the tungsten etch rate to the glass etch rate across the entire surface of the structure as would be required for ideal planarity of the resulting structure.

SUMMARY OF THE INVENTION

This invention seeks to obviate or mitigate the problems discussed above by providing improved FIG methods for making interconnect structures and interconnect structures made by those methods.

Accordingly, one aspect of this invention provides a method for making interconnect structures for semiconductor devices which are covered with a first substantially planar dielectric insulating layer. The first insulating layer has contact holes which extend through the insulating layer over contact regions of the devices. The contact holes are filled with conductive material. The method comprises:

forming a layer of seed material on the first substantially planar dielectric layer at predetermined locations where interconnect conductor is desired;

forming a second substantially planar dielectric insulating layer over the first substantially planar dielectric insulating layer, the second layer having openings extending therethrough at the predetermined locations to expose at least a portion of the seed material; and selectively depositing conductive material on the exposed seed material to fill the openings.

The step of forming a layer of seed material may comprise depositing a layer of seed material over the entire surface of the first dielectric layer, and patterning the layer of seed material to leave seed material only at the predetermined desired locations. In this case, the seed material may be a material in the group consisting of aluminum alloys, refractory metals and metal silicides.

The step of forming the second substantially planar dielectric insulating layer may comprise depositing a substantially planar layer of $SiO_2$ over the first dielectric insulating layer, depositing a layer of photoresist over the $SiO_2$ layer, patterning the layer of photoresist to expose the $SiO_2$ layer at the predetermined locations, etching the $SiO_2$ layer through the patterned photoresist to form openings through the SiO2 layer at the predetermined locations, and removing the patterned photoresist. In this case, the seed material may act as an etch stop to inhibit etching of the conductive material filling the contact holes during etching of the $SiO_2$ layer.

The step of selectively depositing conductive material to fill the openings may comprise selectively depositing tungsten on the seed material by selective CVD. In this case, a layer of metal silicide may be formed on side walls of the openings extending through the second dielectric layer before selectively depositing the tungsten and the tungsten may be selectively deposited on the metal silicide and on the exposed seed material to fill the openings. This improves the rate of tungsten deposition, and improves the adherence of the tungsten to the side walls of the openings.

Alternatively, the step of selectively depositing conductive material to fill the openings may comprise selectively depositing a metal which is a member of the group consisting of nickel, copper, gold and palladium on the seed material by selective electroless plating.

Where the first dielectric layer is a layer of $SiO_2$, the step of forming a layer of seed material may comprise selectively implanting silicon ions into the first dielectric layer at the predetermined locations, and the step of selectively depositing conductive material on the exposed seed material to fill the openings may comprise depositing tungsten by selective CVD.

The steps of the method may be repeated to form a multilevel interconnect structure.

The methods according to the invention replace the tungsten blanket deposition and etch back steps in the method of Broadbent et al with a selective deposition of conductive material only in the openings where interconnect conductor is desired. Consequently the methods according to the invention avoid problems associated with nonuniform etching of the tungsten blanket as described above in the discussion of the method of Broadbent et al. In particular, the methods according to the invention avoid removal of conductive material from openings on one part of the structure before dielectric insulating material between grooves is exposed on another part of the structure. Undesired short circuits and open circuits are thereby avoided. Moreover, there is no need to establish a uniform conductive material etch rate matched to the insulating material etch rate across the entire surface of the structure to achieve good planarity of the resulting structure as in the method of Broadbent et al.

Another aspect of this invention provides an interconnect structure for semiconductor devices which are covered with a first substantially planar dielectric insulating layer. The insulating layer has contact holes extending therethrough over contacts of the devices, and the contact holes are filled with conductive material. The interconnect structure comprises:

a layer of seed material on the first substantially planar dielectric layer at predetermined locations;

a second substantially planar dielectric insulating layer over the first substantially planar dielectric insulating layer, the second layer having openings extending therethrough at the predetermined locations; and conductive material filling the openings and contacting the seed material.

BRIEF DESCRIPTION OF THE DRAWINGS

Embodiments of the invention will now be described by way of example only with reference to the accompanying drawings, in which.

DESCRIPTION OF EMBODIMENTS

Figure 1A:
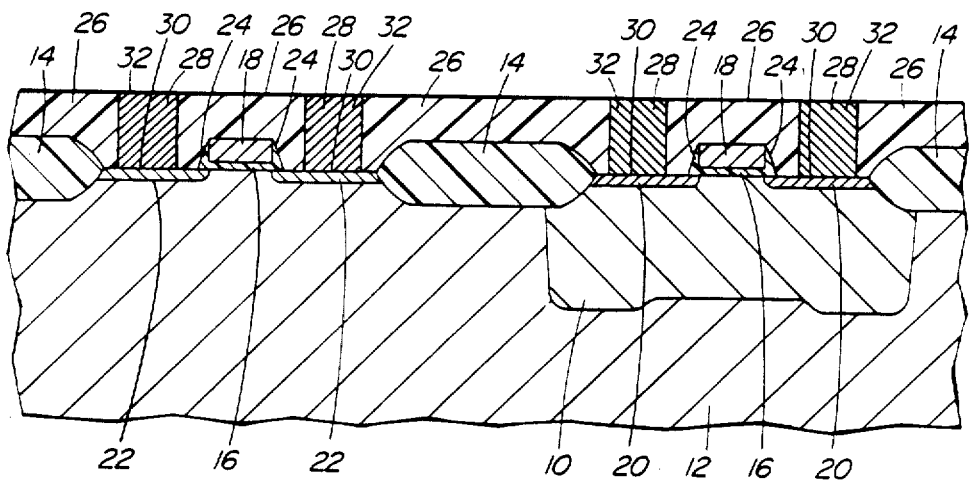
FIGS. 1a-1e are cross-sectional views of an interconnect structure at successive stages of its manufacture according to a FIG method taught by Broadbent et al.

FIG. 1a shows a portion of a silicon gate CMOS integrated circuit made using conventional silicon gate CMOS fabrication techniques. In particular, p-type doped wells 10 are formed at desired locations in an n-type silicon substrate 12, and a field oxide 14 is grown at other selected locations on the substrate 12. Gate oxide 16 is grown through openings in the field oxide 14, and n-doped polysilicon gates 18 are formed on the gate oxide 16. The polysilicon gates 18 and field oxide 14 are used to perform self-aligned source and drain diffusions 20, 22. N-type dopants are used to form the source and drain diffusions 20 in the p-type wells 10, and p-type dopants are used to form the source and drain diffusions 22 outside of the p-type wells 10. A sidewall oxide 24 is formed on the polysilicon gates 18, and a dielectric insulating layer in the form of further oxide layer 26 is deposited over the CMOS devices and planarized using REB techniques. Contact holes 28 are formed through the oxide layer 26 to expose contact regions 30 of the CMOS devices by conventional masking and etching steps (i.e. by depositing a layer of photoresist over the oxide layer 26, patterning the layer of photoresist to expose the oxide layer 26 at predetermined locations where contact holes are desired, etching the oxide layer 26 through the patterned photoresist to form contact holes exposing the contact regions 30 of the devices, and removing the patterned photoresist). Al-Si alloy 32 is deposited and patterned to fill the contact holes 28 and define contacts for the CMOS devices.

Figure 1B:
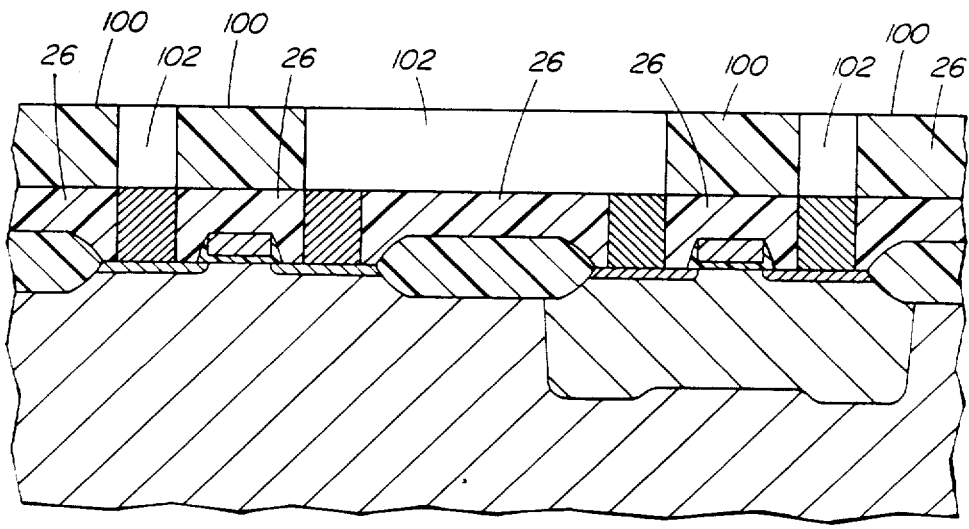
Figure 1C:
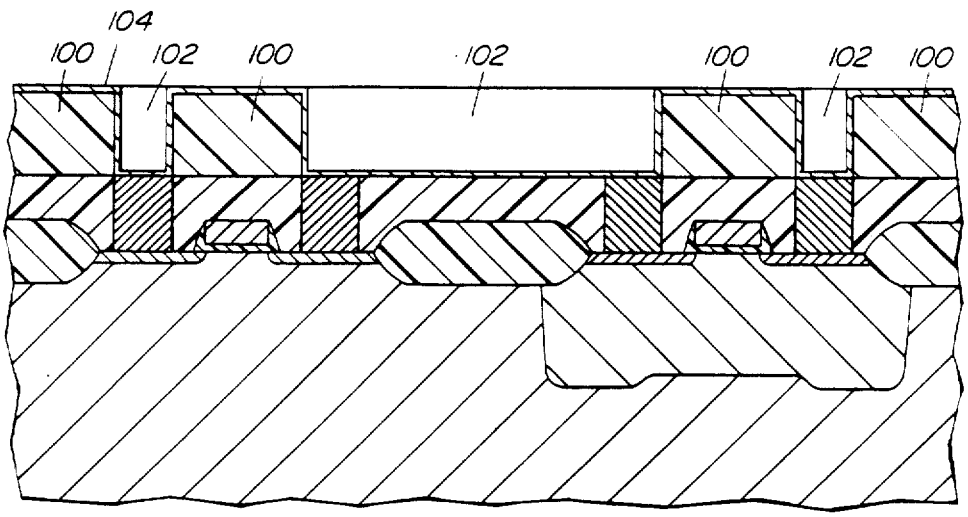
Figure 1D:
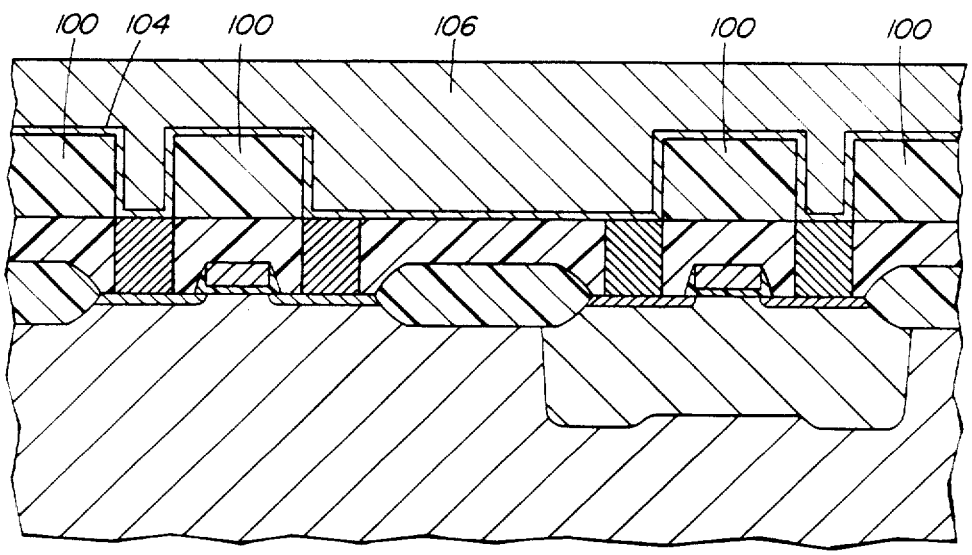
Figure 1E:
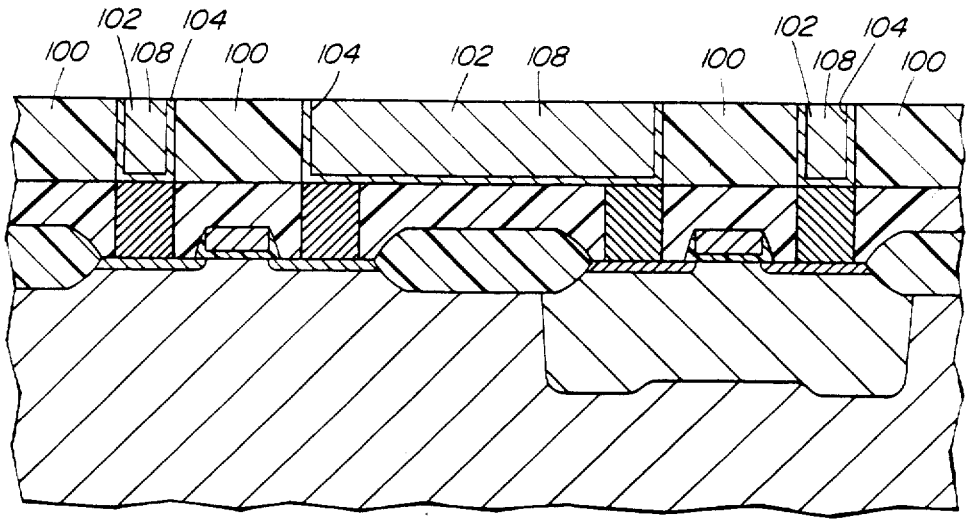

In the Filled In Groove (FIG) method for making interconnect structures as proposed by Broadbent et al (IEEE Transactions on Electron Devices, Vol. 35, No. 7, pp. 952-956, July 1988), a layer of PhosphoSilicate Glass (PSG) 100 is deposited by Chemical Vapour Deposition (CVD) over the oxide layer 26 and patterned using conventional masking and plasma etching steps to form grooves 102 extending through the PSG layer 100 where interconnect conductor is desired. The PSG layer 100 and grooves 102 are shown in FIG. 1b. A tungsten-titanium adhesion bilayer 104 is deposited over the PSG layer 10 0 and in the grooves 102 by DC magnetron sputtering as shown in FIG. 1c, followed by Chemical Vapour Deposition (CVD) of a tungsten blanket 106 as shown in FIG. 1d. The tungsten blanket 106 is etched back in a 30 plasma etcher using $NF_3/O_2$ chemistry to leave tungsten interconnect metal 108 only in the grooves 102 as shown in FIG. 1e.

As illustrated, this technique provides a substantially planar interconnect structure which can be built up to form a multilevel interconnect structure by repetition of the steps described above. Unfortunately, loading effects encountered during the etch back step reduce the effectiveness of this technique. In particular, the local etch rate of the tungsten blanket 106 is found to be dependent on the ratio between the surface area covered by tungsten 106 and the surface area of exposed PSG 100. Consequently tungsten 106 is removed faster from portions of the structure where a relatively large surface area of PSG 100 is exposed than from portions of the structure where little or no PSG 100 is exposed. Thus, any nonuniformity in the deposition of the tungsten blanket 106 which results in nonuniform thickness of the tungsten blanket 106 can result in total removal of tungsten 106 from grooves 102 on one part of the structure before the PSG 100 between grooves 102 is exposed on another part of the structure. This results in undesired open circuits and short circuits in the interconnect structure. Moreover, nonuniformity of the tungsten etch rate prevents matching of the tungsten etch rate to the PSG etch rate across the entire surface of the structure as would be required for ideal planarity of the resulting structure.

Figure 2A:
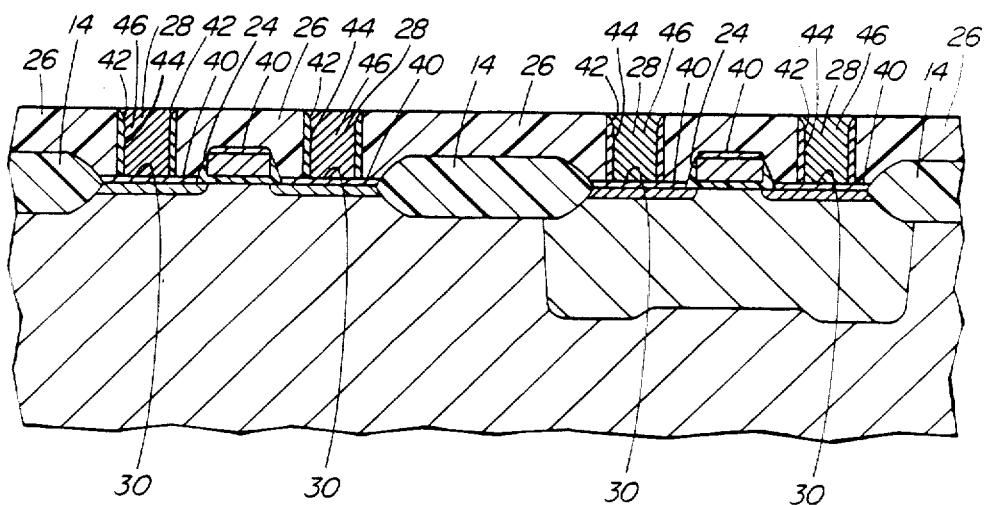
FIGS. 2a-2e are cross-sectional views of an interconnect structure at successive stages of its manufacture according to a method according to a first embodiment.

An improved Fill In Groove (FIG) method for making an interconnect structure according to a first embodiment is applicable to the CMOS integrated circuit structure shown in FIG. 1a, but will be described as applied to an improved CMOS integrated circuit structure as shown in FIG. 2a. The CMOS structure of FIG. 2a differs from the CMOS structure of FIG. 1a in that titanium silicide contacts 40 are formed at the gate, source and drain contact regions by depositing titanium on the upper surface of the structure, heating the structure to cause silicidation of the titanium at the gate, source and drain contacts where it comes into contact with polysilicon or silicon, and selectively etching unreacted titanium from the field and sidewall oxides 14, 24 before depositing oxide layer 26 and forming contact holes 28. The side walls 42 of the contact holes 28 are coated with tungsten silicide 44 by Chemical Vapour Deposition (CVD) of a conformal layer of tungsten silicide on the bottoms 30 of the contact holes 28, the side walls 42 of the contact holes 28 and an upper surface of the oxide layer 26, and preferential removal of the tungsten silicide from the oxide layer 26 by anisotropic reactive ion etching. Conductive material in the form of tungsten 46 is then selectively deposited on the bottoms 30 and side walls 42 of the contact holes 28 to fill the contact holes 28. The resulting contact structure is more reliable than the conventional Al-Si contact structure shown in FIG. 1a, and its fabrication is discussed in greater detail in co-pending U.S. application Ser. No. 207,568 filed June 16, 1988 now U.S. Pat. No. 4,898,841 in the name of Vu Quoc Ho. Apart from the different contact structure, the CMOS structure shown in FIG. 2a is identical to the conventional CMOS structure shown in FIG. 1a.

Figure 2B:
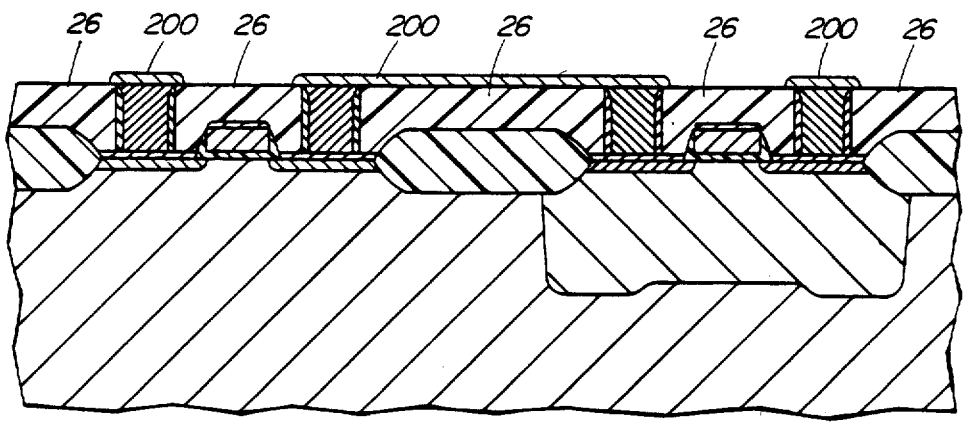

In the FIG method according to a first embodiment, a layer 200 of tungsten silicide approximately 500 angstroms thick is deposited over the entire surface of the oxide layer by CVD. The tungsten silicide layer 200 is patterned using conventional photoresist masking and etching techniques to leave tungsten silicide only at predetermined locations where interconnect conductor is desired, as shown in FIG. 2b.

Figure 2C:
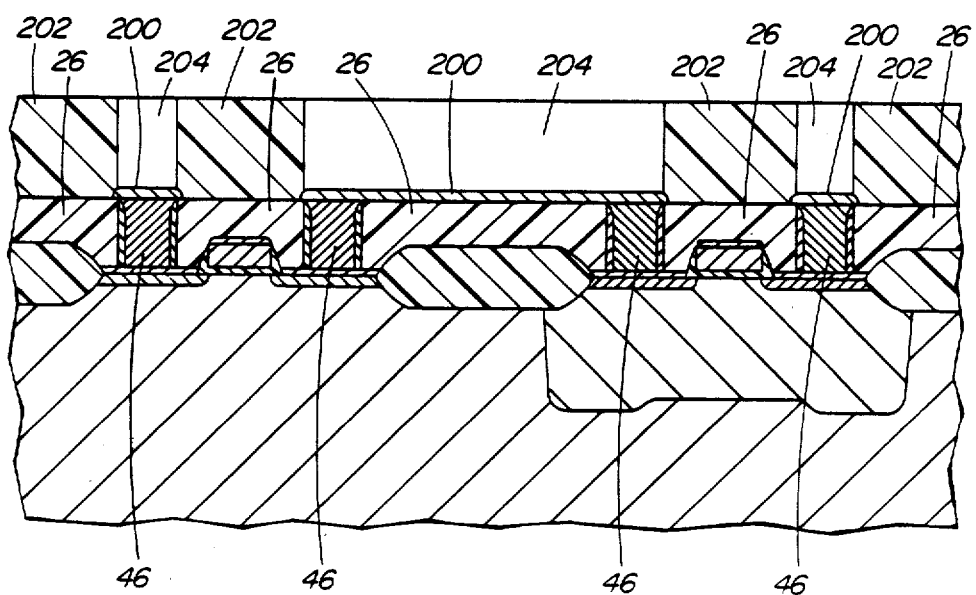

A substantially planar dielectric insulating layer in the form of a $SiO_2$ layer 202 is formed over the oxide layer 26, and the oxide layer 202 is patterned using conventional photoresist masking and etching techniques to define openings 204 extending through the oxide layer 202 at the predetermined locations to expose at least a portion of the tungsten silicide layer 200. During etching of the oxide layer 202, the tungsten silicide layer 200 acts as an etch stop layer to prevent removal of underlying oxide 26 or tungsten contacts 46. The resulting structure is shown in FIG. 2c.

Figure 2D:
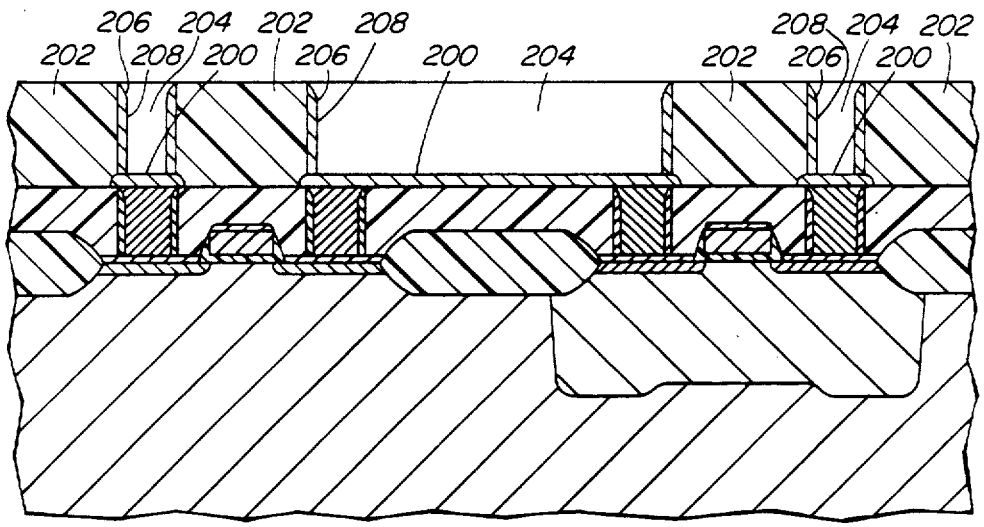

Side walls 206 of the openings 204 are coated with tungsten silicide 208 by Chemical Vapour Deposition (CVD) of a conformal layer of tungsten silicide on the exposed tungsten silicide layer 200, the side walls 206 of the openings 204 and an upper surface of the oxide layer 202, and preferential removal of the tungsten silicide from the oxide layer 202 by anisotropic reactive ion etching. Tungsten silicide is also removed from the layer 200 at the bottoms of the openings 204 during the anisotropic etching step, but the thickness of the layer 200 is such that the oxide layer 202 is exposed before all of the layer 200 has been removed. Consequently, some of the tungsten silicide layer 200 remains at the bottoms of the openings 204 when the etching step is complete. The resulting structure is shown in FIG. 2d.

Figure 2E:
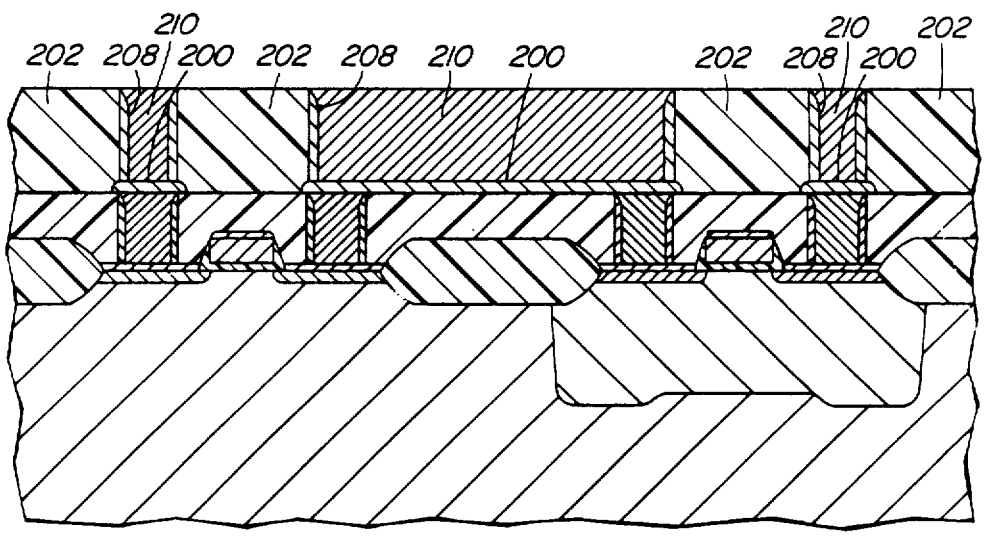

Conductive material in the form of tungsten 210 is then selectively deposited on the tungsten silicide 200, 208 lining the openings 204 by selective CVD to fill the openings 204 and produce a substantially planar interconnect structure as shown in FIG. 2e. The tungsten silicide layers 200, 208 act as 'seed layers' during the selective deposition. The tungsten 210 is deposited only on the exposed tungsten silicide 200, 208 and not on exposed surfaces of the oxide layer 202.

The steps of the method according to the first embodiment may be repeated to build up a multilevel interconnect structure.

The seed material used in the improved FIG method described above may be any material in the group consisting of aluminum alloys, refractory metals and metal silicides, and the conductive material used to fill the openings may be any conductive material which can be selectively deposited on such seed material.

Figure 3A:
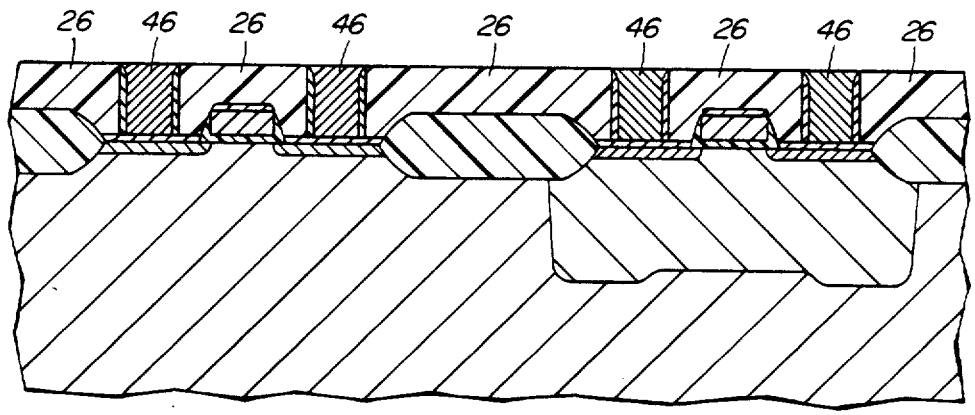
FIGS. 3a-3d are cross-sectional views of an interconnect structure at successive stages of its manufacture according to a method according to a second embodiment.
Figure 3B:
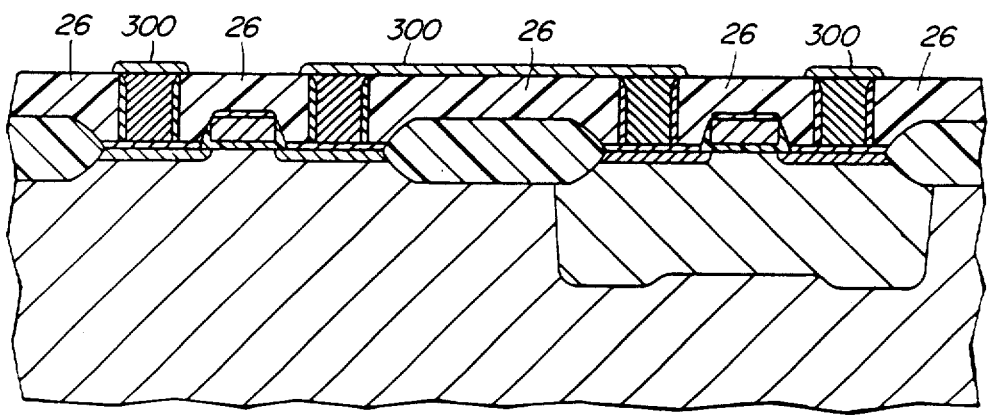
Figure 3C:
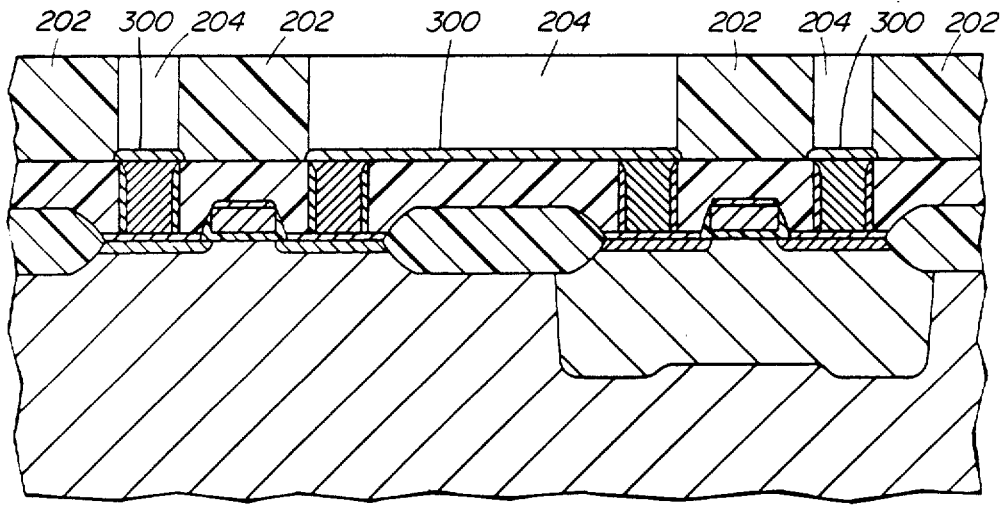
Figure 3D:
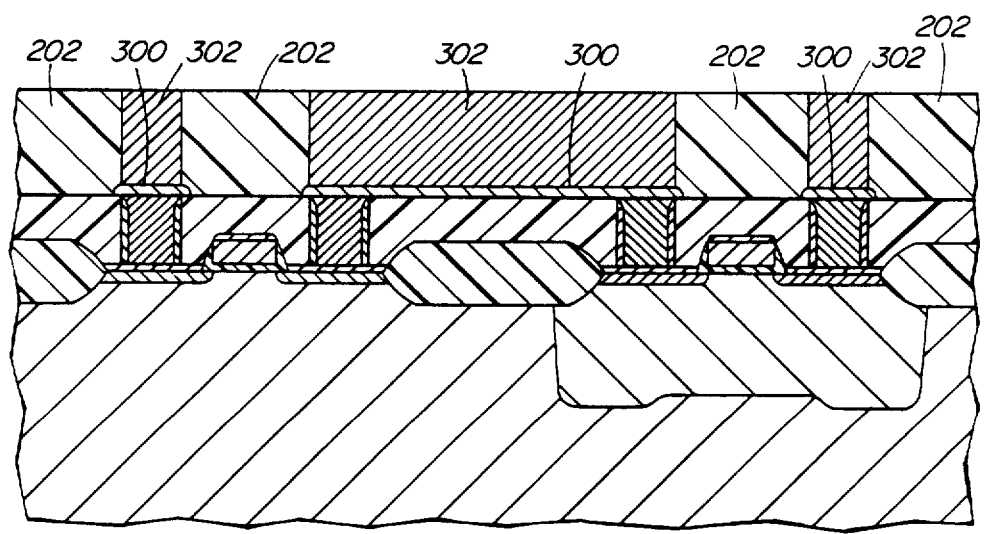

For example, in a method according to a second embodiment shown in FIGS. 3a-3d, the steps shown in FIGS. 3a-3c are identical to the steps shown in FIGS. 2-2c except that the tungsten silicide seed layer 200 is replaced by an Al-Si seed layer 300. The steps shown in FIGS. 2d-2e are replaced by selective electroless deposition of nickel on the Al-Si seed layer 300 exposed at the bottoms of the openings 204 in the $SiO_2$ layer 202 to fill the openings 204, as shown in FIG. 3d.

Such a selective electroless deposition process is described by Pai et al in the Proceedings of the IEEE V-MIC Conference, pp. 331-337, June 13-14, 1988. The surface of the Al-Si seed layer 300 is etched in dilute HF to remove native oxide and create surface roughness which improves adhesion of the plated nickel. A solution of $PdCl_2$ in HCl and acetic acid is brought into contact with the etched Al-Si surface to deposit Pd particles on the surface of the Al-Si seed layer 300. The Pd particles act as a catalyst for the nickel plating reaction which follows. A solution of nickel ions in sodium hypophosphite having a pH value between 8 and 9 is then brought into contact with the Al-Si seed layer 300 and held at 70 degrees Celsius. Current is passed through the solution to plate nickel 302 onto the Al-Si seed layer 300 until the openings 204 are filled. The plated nickel 302 is annealed at 400 degrees Celsius in $N_2$ and alloyed at 450 degrees Celsius in $N_2$. Other metals such as copper, gold or palladium can be used in place of nickel in electroless plating processes.

Figure 4A:
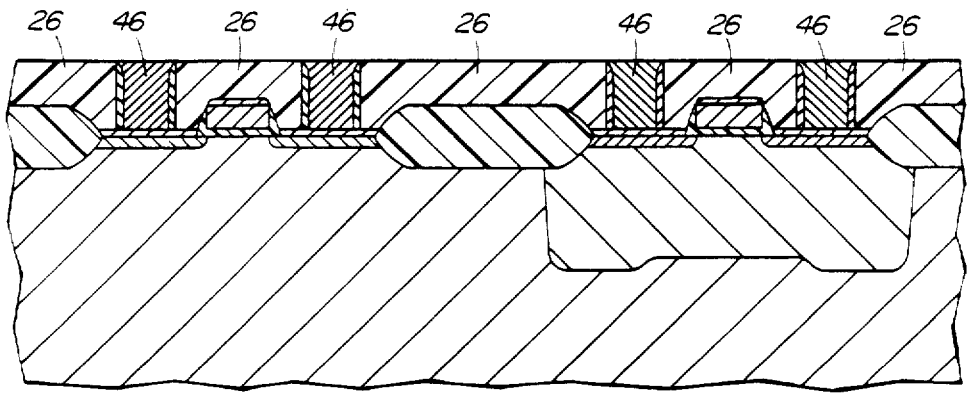
FIGS. 4a-4d are cross-sectional views of an interconnect structure at successive stages of its manufacture according to a method according to a third embodiment.
Figure 4B:
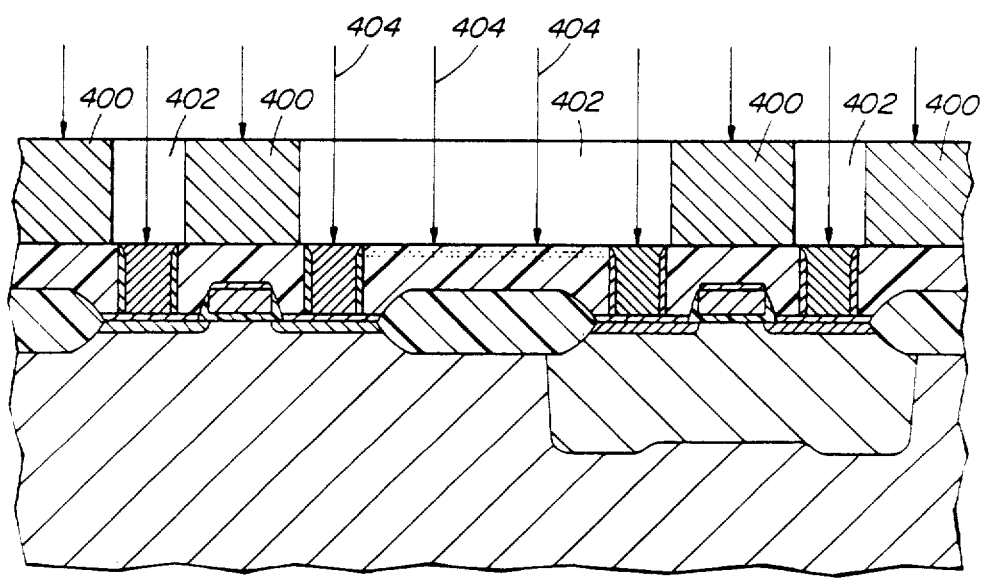

In another embodiment shown in FIGS. 4a-4d, the $SiO_2$ layer 26 shown in FIG. 4a is coated with a 3000 angstrom thick molybdenum film 400 deposited by DC magnetron sputtering. The molybdenum film 400 is patterned using conventional photoresist masking and reactive ion etching methods to define openings 402 through the molybdenum film 400 at predetermined locations where interconnect metal is desired, as shown in FIG. 4b. Silicon ions 404 are implanted at 25 keV through the openings into the $SiO_2$ layer 26. The molybdenum film 400 acts as a masking layer during the implantation process, absorbing the silicon ions at locations other than those predetermined locations where interconnect metal is desired.

Figure 4C:
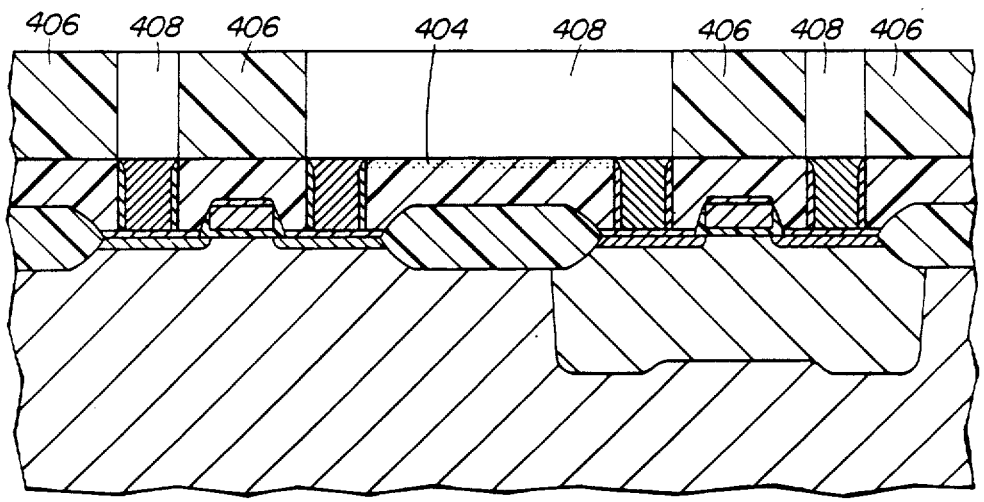

The molybdenum film 400 is removed in a 1:1 $H_2SO_4/H_2O_2$ solution and the $SiO_2$ surface is etched in a 1% HF solution to bring the implanted silicon closer to the exposed surface. A further $SiO_2$ layer 406 is then deposited on the SiO2 layer 26 and patterned using conventional photoresist masking and etching methods to define openings 408 at the predetermined locations where interconnect metal is desired. The resulting structure is shown in FIG. 4c.

Figure 4D:
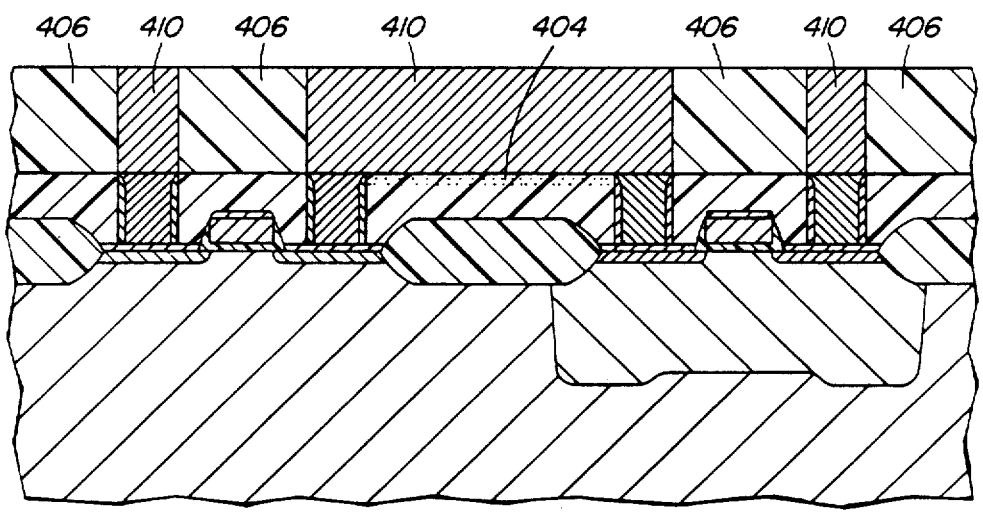

Tungsten 410 is deposited in the openings 408 by selective CVD to substantially fill the openings 408 as shown in FIG. 4d. The implanted $SiO_2$ which is exposed by the openings 408 acts as a seed material for the selective deposition of the tungsten 410.

Further details of selective CVD of tungsten on silicon implanted $SiO_2$ are provided by Hennessy et al in the Journal of the Electrochemical Society, Solid State Science and Technology, pp. 1730-1734, July 1988.

In each of the three embodiments described above, the tungsten blanket deposition and etch back steps of the method of Broadbent et al are replaced with a selective deposition of conductive material only in the openings where interconnect conductor is desired. Consequently the methods according to the embodiments avoid problems associated with nonuniform etching of the tungsten blanket as described above in the discussion of the method of Broadbent et al. In particular, the methods according to the embodiments avoid removal of conductive material from openings on one part of the structure before dielectric insulating material between grooves is exposed on another part of the structure. Undesired short circuits and open circuits are thereby avoided. Moreover, there is no need to establish a uniform conductive material etch rate matched to the insulating material etch rate across the entire surface of the structure to achieve good planarity of the resulting structure as in the method of Broadbent et al.

I claim:

1. A method for making interconnect structures for semiconductor devices, said devices initially being covered with a first substantially planar dielectric insulating layer having contact holes extending therethrough over contact regions of the devices, and said contact holes being filled with conductive material, the method comprising:
   providing said devices initially being covered with a first substantially planar dielectric insulating layer;
   forming a layer of seed material at and connected to an exposed surface of said first substantially planar dielectric insulating layer and at and connected to said filled contact holes at predetermined locations where interconnect conductor for interconnecting said semiconductor devices is desired;
   forming a second substantially planar dielectric insulating layer over the first substantially planar dielectric insulating layer;
   forming openings extending through the second layer at the predetermined locations to expose at least a portion of the seed material; and
   selectively depositing conductive material on the exposed seed material to fill the openings while avoiding deposition of the conductive material on the second dielectric insulating layer adjacent to the seed material.

2. A method as defined in claim 1, wherein the step of forming a layer of seed material comprises:
   depositing a layer of seed material over the entire surface of the first dielectric layer; and
   patterning the layer of seed material to leave seed material only at the predetermined desired locations.

3. A method as defined in claim 2, wherein the seed material is a material in the group consisting of aluminum alloys, refractory metals and metal silicides.

4. A method as defined in claim 1, wherein:
   the first dielectric layer is a layer of $SiO_2$;
   the step of forming a layer of seed material comprises selectively implanting silicon ions into the first dielectric layer at the predetermined locations; and
   the step of selectively depositing conductive material on the exposed seed material to fill the openings comprises depositing tungsten by selective CVD.

5. A method as defined in claim 4, wherein the step of selectively implanting silicon ions into the first dielectric layer at the predetermined locations comprises:
   forming a masking layer over the first dielectric layer, the masking layer having openings therethrough at the predetermined locations to expose the first dielectric layer; and
   implanting ions through the openings into the first dielectric layer at the predetermined locations, the masking layer absorbing ions at locations other than the predetermined locations.

6. A method as defined in claim 1, wherein the steps of forming the second substantially planar dielectric insulating layer and forming openings in the second layer comprise:
   depositing a substantially planar layer of $SiO_2$ over the first dielectric insulating layer;
   depositing a layer of photoresist over the $SiO_2$ layer;
   patterning the layer of photoresist to expose the $SiO_2$ layer at the predetermined locations;
   etching the $SiO_2$ layer through the patterned photoresist to form openings through the $SiO_2$ layer at the predetermined locations; and
   removing the patterned photoresist.

7. A method as defined in claim 6, wherein the seed material acts as an etch stop to inhibit etching of the conductive material filling the contact holes during etching of the $SiO_2$ layer.

8. A method as defined in claim 1, wherein the step of selectively depositing conductive material to fill the openings comprises:
   selectively depositing tungsten on the seed material by selective CVD.

9. A method as defined in claim 8, comprising:
   forming a layer of metal silicide on side walls of the openings extending through the second dielectric layer before selectively depositing the tungsten; and
   selectively depositing the tungsten on the metal silicide and on the exposed seed material to fill the openings.

10. A method as defined in claim 1, wherein the step of selectively depositing conductive material to fill the openings comprises:
    selectively depositing a metal which is a member of the group consisting of nickel, copper, gold and palladium on the seed material by selective electroless plating.

11. A method as defined in claim 1, wherein the steps are repeated to form a multilevel interconnect structure.

12. A method as defined in claim 1, further comprising:
    forming the first substantially planar insulating layer by:
    depositing a substantially planar layer of $SiO_2$ over the devices;
    depositing a layer of photoresist over the $SiO_2$ layer;
    patterning the layer of photoresist to expose the $SiO_2$ layer at predetermined locations where contact holes are desired;
    etching the $SiO_2$ layer through the patterned photoresist to form contact holes exposing contact regions of the devices; and
    removing the patterned photoresist; and
    filling the contact holes with conductive material by selectively depositing conductive material on the contact regions.

13. A method as defined in claim 12, wherein the step of selectively depositing conductive material on the contact regions comprises:
    selectively depositing tungsten on the contact regions by selective CVD.

14. A method as defined in claim 13, comprising:
    forming a layer of metal silicide on side walls of the contact holes before selectively depositing the tungsten; and
    selectively depositing the tungsten on the metal silicide and on the exposed contact regions to fill the contact holes.

* * * * *